(12) United States Patent
Sharan

(10) Patent No.: US 6,258,724 B1
(45) Date of Patent: Jul. 10, 2001

(54) LOW DIELECTRIC CONSTANT DIELECTRIC FILMS AND PROCESS FOR MAKING THE SAME

(75) Inventor: Sujit Sharan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/541,160

(22) Filed: Mar. 31, 2000

Related U.S. Application Data

(62) Division of application No. 09/384,668, filed on Aug. 27, 1999, now Pat. No. 6,140,249.

(51) Int. Cl.$^7$ .................... H01L 21/302; H01L 21/461
(52) U.S. Cl. .................... 438/710; 438/421; 438/422; 438/424; 438/765; 438/790; 257/516; 257/531
(58) Field of Search ..................... 438/710, 765, 438/790, 421–24; 257/516, 531

(56) References Cited

U.S. PATENT DOCUMENTS

| | | |
|---|---|---|
| 5,461,003 | 10/1995 | Havemann et al. . |
| 5,504,042 | 4/1996 | Cho et al. . |
| 5,598,026 | 1/1997 | Kapoor et al. . |
| 5,691,573 | 11/1997 | Avanzino et al. . |
| 5,723,368 | 3/1998 | Cho et al. . |

OTHER PUBLICATIONS

"Aerogel and Xerogel" Dispatches From The World of Computing, Pipeline, PC Magazine, Mar. 10, 1998, p. 9.

Wei et al. "Controlled growth of SIO tunnel barrier and crystalline Si quantum wells for Si resonant tunneling diodes" J. Appl Phy 81(9), May 1, 1997, pp. 6415–6424.

*Primary Examiner*—Matthew Smith
*Assistant Examiner*—Granvill Lee, Jr.
(74) *Attorney, Agent, or Firm*—Killworth, Gottman, Hagan & Schaeff, L.L.P.

(57) ABSTRACT

A low dielectric constant material and a process for controllably reducing the dielectric constant of a layer of such material is provided and comprises the step of exposing the layer of dielectric material to a concentration of an oxygen plasma at a temperature and a pressure sufficient for the oxygen plasma to etch the layer of dielectric material to form voids in the layer of dielectric material. The process may also include the step of controlling the reduction of the dielectric constant by controlling the size and density of the voids. The size and density of the voids can be controlled by varying the pressure under which the reaction takes place, by varying the temperature at which the reaction takes place, by varying the concentration of the oxygen plasma used in the reaction or by varying a combination of these parameters. The process of the present invention is particularly useful in the fabrication of semiconductor devices.

21 Claims, 4 Drawing Sheets

LOW DIELECTRIC CONSTANT DIELECTRIC FILMS AND PROCESS FOR MAKING THE SAME

CROSS REFERENCE TO RELATED APPLICATIONS

This application is a division of U.S. patent application Ser. No. 09/384,668, filed Aug. 27, 1999 now U.S. Pat. No. 6,140,249.

BACKGROUND OF THE INVENTION

The present invention relates to a process for forming a dielectric film having a low dielectric constant. In the process of the present invention, a dielectric film is etched with an oxygen plasma to form voids in the dielectric film. These voids serve to reduce the dielectric constant of the dielectric film. The present invention also relates to semiconductor devices which incorporate such reduced dielectric constant dielectric films.

In very large scale integrated (VLSI) circuit devices, several wiring layers connect the active and/or passive elements in a semiconductor chip. The interconnection structure comprises thin conductive lines which are separated by an insulation material in one layer or level and which are connected through vias or studs from contacts of the elements of the semiconductor chip or to a similar layer in another level of interconnections. This interconnection structure is similar to a transmission line because signals being transmitted in these wiring layers experience propagation delays. Propagation delays are referred to as being RC delays because they depend upon the resistance (R) of the material of the conductive line or runner and the capacitance (C) between adjacent lines. With the present trend toward more and more levels of integration on these circuit devices, the spaces between adjacent lines in which to insert insulation material are being narrowed. These narrower spaces increase the capacitance between adjacent lines and place increased demands on the insulative properties of the insulation material formed between the conductive lines.

The capacitance (C) of a material is calculated by multiplying the dielectric constant (κ) of the material by the area (A) of the opposing faces of the conductive lines and dividing the product by the distance (D) between the conductive lines. A decrease in the distance between the conductive lines results in an increase in capacitance. Since signal delay of a signal transmitted on the conductive lines is controlled by the RC constant, an increase in capacitance degrades the performance of the integrated circuit.

Currently in the art, silicon compounds are used as the insulation material between the conductive lines. Silicon dioxide, for example, has a dielectric constant between 3.5 and 4.0. In comparison, a vacuum has a dielectric constant of 0 and provides the basis for measurement of the dielectric constant of materials. As another example, air and other insulating gases each have a dielectric constant of about 1 or slightly less than 1.

Organic films, such as polyimides, silosesquioxanes and hydroxysilsequioxanes, have been proposed for use as insulation layers between adjacent conductive lines. While most organic dielectric films have a dielectric constant (κ) which is lower than that of silicon dioxide, organic dielectric films are more subject to contamination and shrinkage than silicon dioxide films. Further, organic dielectric films are hydroscopic and any absorbed moisture has the potential to corrode the metal lines. Additionally, organic films are also not as thermally and structurally stable as silicon dioxide films. Thus, it is not currently desirable to use organic based dielectric films in the formation of VLSI circuit devices.

One solution has been proposed by Avanzino et al. in U.S. Pat. No. 5,691,573. Avanzino et al. propose conventionally depositing an insulating layer on and between conductive lines and then masking the conductive lines and removing the insulation in the gap between the lines. A nonconformal silicon containing insulating layer is then deposited in the narrow gap and, due to the nonconformal step coverage, only a thin layer is coated on the vertical walls of the conductive lines on opposite sides of the narrow gaps. However, a thick layer forms on the top and shoulders of the conductive lines. As the insulation layer grows, the thick layer reduces the width of the gap at the top of the lines until it bridges across the narrow gap and creates a void between the lines. At least one-third of the gap is filled so that the effective dielectric constant of the combined insulating material and the void is at or below about 3. However, the process described by Avanzino et al. requires a considerable amount of time to complete because of the number of steps involved in the process.

U.S. Pat. No. 5,598,026 to Kapoor et al. proposes forming a porous layer of a dielectric material to serve as an insulation layer between two conductive layers of an integrated circuit. Kapoor et al. teach that the porous layer of dielectric material is formed by depositing a composite layer comprising a mixture of two or more materials. At least one of the materials which forms the mixture is extractable from the mixture after the layer is formed and at least one other material which forms the mixture will remain after the extraction as a porous matrix comprising a low dielectric constant insulation material. The low dielectric constant material will have a dielectric constant of less than 3.9, the dielectric constant of $SiO_2$. The extractable material is removed from the layer to remain by means of a solvent which removes the extractable material and produces the low dielectric constant insulation material. To avoid contamination problems in the low dielectric constant insulation material, one or more layers of nonporous low dielectric constant insulation materials are preferably also formed above and/or below the porous matrix comprising the low dielectric constant insulation material. However, the Kapoor et al. process may cause contaminants to be introduced into the VLSI circuit device fabrication process through the use of a solvent to remove the extractable material. Further, the Kapoor et al. process can not be performed in situ.

Another solution is provided in U.S. Pat. No. 5,723,368 to Cho et al. Cho et al. describe a method for making a porous dielectric material for use in semiconductor devices. In the method taught by Cho et al., surface hydroxyl groups are removed from the surface of a porous substrate by baking the substrate in the range of 100° C. to 490° C. The porous substrate is formed from a gel which requires generally about one day of aging before the water content of the gel is removed to create the pores. The method may further comprise baking the substrate in a reducing atmosphere. More preferably, the reaction is carried out at or below ambient pressure. However, this process requires several additional steps, some of which can not be performed in situ and others which require an extended amount of time to complete.

Thus, a need still exists in the art for a method for forming a dielectric layer for a semiconductor device in which the dielectric layer has a reduced dielectric constant. Desirably, this method would be simpler, faster, and involve fewer steps than currently used processes and would be less subject to contamination. A need also exists for semiconductor devices which incorporate a layer of dielectric material which has a reduced dielectric constant.

SUMMARY OF THE INVENTION

The present invention provides a solution to the current needs in the art by providing a method for forming a layer of a dielectric material between adjacent conductive lines such that the dielectric constant of the dielectric material is reduced. This reduction in the dielectric constant of the dielectric material results in a corresponding decrease in the capacitance of the dielectric material thus reducing RC delays. The method of the present invention is simpler and involves fewer steps than conventional processes. The method of the present invention is less subject to contamination because it does not employ organic films or use solvents to remove a component of the dielectric layer to cause the dielectric constant of the layer of dielectric material to be reduced.

One aspect of the present invention is directed to a process for controllably reducing the dielectric constant of a layer of dielectric material. The process includes the step of exposing the layer of dielectric material to a concentration of an oxygen plasma at a temperature and a pressure sufficient for the oxygen plasma to etch the layer of dielectric material to form voids in the layer of dielectric material. The process may also include the step of controlling the reduction of the dielectric constant by controlling the size and density of the voids. The size and density of the voids can be controlled by varying the pressure under which the reaction takes place, by varying the temperature at which the reaction takes place, by varying the concentration of the oxygen plasma used in the reaction or by varying a combination of these parameters.

Another aspect of the present invention is directed to a process for forming a semiconductor device. The process includes the steps of: providing a semiconductor substrate; forming a layer of a dielectric material on at least a portion of the semiconductor substrate, the dielectric material having a dielectric constant; and exposing the layer of dielectric material to a concentration of an oxygen plasma at a temperature and a pressure sufficient for the oxygen plasma to etch the layer of dielectric material to form voids in the layer of dielectric material, the voids reducing the dielectric constant of the dielectric material. The process may also include the step of forming a layer of a second dielectric material on the layer of dielectric material.

Still another aspect of the present invention is directed to a process for the formation of a dielectric layer of a semiconductor device. This process comprises the steps of: depositing a layer of a first dielectric material between a pair of conductive lines of a semiconductor device; exposing the layer of first dielectric material to a concentration of an oxygen plasma at a, temperature and a pressure sufficient for the oxygen plasma to etch the layer of first dielectric material to form voids in the layer of first dielectric material, the voids reducing the dielectric constant of the first dielectric material; and forming a layer of a second dielectric material on the layer of first dielectric material.

Yet another aspect of the present invention is directed to a process for the formation of a dielectric layer of a semiconductor device comprising the steps of: providing a semiconductor substrate; forming a first conductive line and a second conductive line on the semiconductor substrate, the first conductive line and the second conductive line defining a space therebetween; forming a layer of a first dielectric material between the first conductive line and the second conductive line in the space; and exposing the layer of dielectric material to a concentration of an oxygen plasma at a temperature and a pressure sufficient for the oxygen plasma to etch the layer of dielectric material to form voids in the layer of dielectric material, the voids reducing the dielectric constant of the dielectric material.

An additional aspect of the present invention is directed to a process for the formation of a dielectric layer of a semiconductor device. The process comprises the steps of: providing a semiconductor substrate; forming a first conductive line and a second conductive line on the semiconductor substrate, the first conductive line and the second conductive line defining a space therebetween, each of the first conductive line and the second conductive line having a surface; forming a layer of a first dielectric material between the first conductive line and the second conductive line in the space, the layer of first dielectric material being substantially coplanar with the surfaces of the first conductive line and the second conductive line; exposing the layer of first dielectric material to a concentration of an oxygen plasma at a temperature and a pressure sufficient for the oxygen plasma to etch the layer of first dielectric material to form voids in the layer of first dielectric material, the voids reducing the dielectric constant of the first dielectric material; and forming a layer of a second dielectric material on the layer of first dielectric material such that the layer of second dielectric material covers the surfaces of the first and second conductive lines.

Another aspect of the present invention is directed to a process for forming a semiconductor device. The process comprises the steps of: providing a semiconductor substrate having a layer of a conductive material formed thereon; forming a layer of a dielectric material on at least a portion of the layer of conductive material, the layer of dielectric material having a dielectric constant; and exposing the layer of dielectric material to a concentration of an oxygen plasma at a temperature and a pressure sufficient for the oxygen plasma to etch the layer of dielectric material to form voids in the layer of dielectric material, the voids reducing the dielectric constant of the dielectric material. This process may also include the step of forming a layer of a second dielectric material on the layer of dielectric material.

Yet another aspect of the present invention is directed to a process for forming an integrated circuit. The process comprises the steps of: providing an integrated circuit including a plurality of active devices and multilevel interconnections, the integrated circuit further including at least one interconnection level and at least one pair of conductive lines; forming a layer of a dielectric material between the conductive lines, the layer of dielectric material having a dielectric constant; exposing the layer of dielectric material to a concentration of an oxygen plasma at a temperature and a pressure sufficient for the oxygen plasma to etch the layer of dielectric material to form voids in the layer of dielectric material, the voids reducing the dielectric constant of the dielectric material; and forming at least one additional layer including an active device, the additional layer being formed over the layer of dielectric material.

Still yet another aspect of the present invention is directed to a process for forming a semiconductor device. The process for forming a semiconductor device comprises the steps of: providing an integrated circuit including a plurality of active devices and multilevel interconnections, the integrated circuit further including at least one interconnection level and at least one pair of conductive lines; forming a layer of a first dielectric material between the conductive lines, the layer of first dielectric material having a dielectric constant; exposing the layer of first dielectric material to a concentration of an oxygen plasma at a temperature and a pressure sufficient for the oxygen plasma to etch the layer of first dielectric material to form voids in the layer of first dielectric material, the voids reducing the dielectric constant of the first dielectric material; forming a layer of a second dielectric material on the layer of first dielectric material such that the layer of the second dielectric material covers the conductive lines; and forming at least one additional layer including an active device, the additional layer being formed over the layer of second dielectric material.

An additional aspect of the present invention is directed to a process for forming a memory array which comprises a plurality of memory cells arranged in rows and columns, each of the plurality of memory cells comprising at least one field effect transistor. The process comprises the steps of: providing a semiconductor substrate; forming sources, drains and gates for each of the field effect transistors on the semiconductor substrate; forming a plurality of conductive lines to interconnect the memory cells, at least two of the plurality of conductive lines defining a space therebetween; forming a layer of a dielectric material in at least one of the spaces, the layer of dielectric material having a dielectric constant; and exposing the layer of dielectric material to a concentration of an oxygen plasma at a temperature and a pressure sufficient for the oxygen plasma to etch the layer of dielectric material to form voids in the layer of dielectric material, the voids reducing the dielectric constant of the dielectric material. This process may also include the step of forming a layer of a second dielectric material over the layer of dielectric material such that the layer of second dielectric material covers the conductive lines.

Still another aspect of the present invention is directed to a process for fabricating a wafer. The process comprises the steps of: providing a wafer including a semiconductor substrate; forming a repeating series of sources, drains and gates for a plurality of field effect transistors on each of a plurality of individual die over the semiconductor substrate; forming a plurality of conductive lines to interconnect the field effect transistors, at least two of the conductive lines defining a space therebetween; forming a layer of a dielectric material in the space, the dielectric material having a dielectric constant; and exposing the layer of dielectric material to a concentration of an oxygen plasma at a temperature and a pressure sufficient for the oxygen plasma to etch the layer of dielectric material to form voids in the layer of dielectric material, the voids reducing the dielectric constant of the dielectric material.

Another aspect of the present invention is directed to a semiconductor device. The semiconductor device includes a semiconductor substrate having a plurality of active devices disposed thereon. A plurality of multilevel interconnection layers are also disposed on the substrate, at least one interconnection layers has at least one pair of conductive lines. The conductive lines define a space therebetween. A layer of a first dielectric material is formed in the space. The dielectric material includes a plurality of voids having been formed therein by treating the layer of dielectric material with an oxygen plasma. The voids are provided to reduce the dielectric constant of the layer of dielectric material. This semiconductor device may also include a layer of a second dielectric material formed over the layer of first dielectric material such that the layer of second dielectric material covers the conductive lines.

Still yet another aspect of the present invention is directed to a memory array. The memory array includes a semiconductor substrate on which a plurality of memory cells are arranged in rows and columns. Each of the plurality of memory cells comprises at least one field effect transistor which comprises a source, a drain and a gate formed on the semiconductor substrate. A plurality of conductive lines interconnect the memory cells. A portion of the plurality of conductive lines define spaces therebetween. A layer of a dielectric material is formed in at least a portion of the spaces. The layer of dielectric material has a dielectric constant and the layer of dielectric material has a plurality of voids formed therein. The voids are formed by treating the layer of dielectric material with an oxygen plasma and the voids reduce the dielectric constant of the dielectric material. The memory array may also include at least one layer of a second dielectric material formed on at least a portion of the layer of dielectric material.

Yet another aspect of the present invention is directed to a semiconductor wafer. The wafer includes a semiconductor substrate. A repeating series of sources, drains and gates for a plurality of field effect transistors on each of a plurality of individual die are formed over the semiconductor substrate. A plurality of conductive lines interconnect the field effect transistors, at least two of the lines defining a space therebetween. A layer of a dielectric material is formed in the space. The dielectric material has a dielectric constant and has a plurality of voids formed therein. The voids are formed by exposing the layer of dielectric material to an oxygen plasma and the voids reduce the dielectric constant of the layer of dielectric material. The semiconductor wafer may also include a layer of a second dielectric material formed on at least a portion of the layer of dielectric material.

Objects and advantages of the present invention will be apparent from the following detailed description, the accompanying drawings and the appended claims.

DETAILED DESCRIPTION OF THE INVENTION

For the purposes of the present application, the preposition "on" refers to formation in contact with the surface of a particular layer, while "over" refers to a formation above and/or in contact with a surface of a particular layer.

Figure 1:
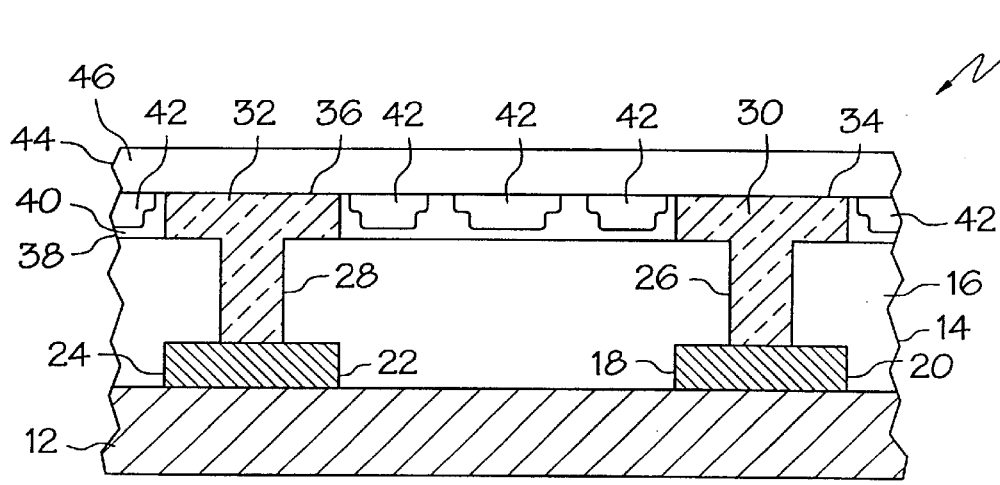
FIG. 1 presents a cross sectional view of a semiconductor device of the present invention.

FIG. 1 presents a cross sectional view of a semiconductor device 10 of the present invention. The device 10 is formed on a semiconductor substrate 12. A layer 14 of an insulation material 16 is formed on the substrate 12. A first layer 18 of a conductive material 20 is formed in the layer 14 of insulation material 16 over the substrate 12. A second layer 22 of a conductive material 24 is also formed in the layer 14 of insulation material 16 over the substrate 12. A first via 26 and a second via 28 are formed in the layer 14 of insulation material 16 and provide access, respectively, to the first layer 18 of conductive material 20 and the second layer 22 of conductive material 24. A first conductive line 30 is formed in the first via 26 and a second conductive line 32 is formed in the second via 28. The first conductive line 30 has a surface 34 and the second conductive line 32 has a surface 36. The first conductive line 30 contacts the first layer 18 of conductive material 20 and the second conductive line 32 contacts the second layer 22 of conductive material 24. The first conductive line 30 and the second conductive line 32 are provided to interconnect various active devices, such as capacitors or field effect transistors, and/or passive devices, such as other conductive lines, on the semiconductor substrate 12 with each other. Often the first conductive line 30 and the second conductive line 32 will interconnect devices through multiple layers on the semiconductor substrate 12.

With continuing reference to FIG. 1, a layer 38 of a first dielectric material 40 is formed on the layer 14 of insulation material 16 at least between the first conductive line 30 and the second conductive line 32. Desirably, the layer 38 of first dielectric material 40 is formed so that it is coplanar with the surfaces 34 and 36 of the first conductive line 30 and the second conductive line 32, respectively. The layer 38 of first dielectric material 40 has a plurality of voids 42 formed therein. The voids 42 are not drawn to scale and shown out of scale solely for ease of illustrating the invention. The voids 42 are formed in the layer 38 of first dielectric material 40 to lower the dielectric constant of the first dielectric material 40. By lowering the dielectric constant of the first dielectric material 40, RC delays can be reduced, if not eliminated. The process by which the voids 42 are formed is discussed below. A layer 44 of a second dielectric material 46 is formed on the layer 38 of first dielectric material 40 and the layer 44 of second dielectric material 46 covers the surfaces 34 and 36 of the conductive lines 30 and 32, respectively.

The substrate 12 is formed from any material currently in use in the art which is used to form substrates for semiconductor devices such as semiconductor device 10. Exemplary materials useful to form the substrate 12 include, but are not limited to, doped or undoped silicon, doped or undoped polycrystalline silicon, gallium arsenide, gallium phosphide, indium arsenide and indium phosphide.

The layer 14 is desirably an insulating material 16 which can be any material currently in use in the art as an insulator or a dielectric. Materials useful for insulating material 16 include, but are not limited to oxides, nitrides, and carbon-containing oxides, and especially silicon or metal oxides and nitrides.

The conductive material 20 and 24 can be any material which conducts an electric current. Exemplary materials useful for forming the conductive material 20 and 24 include, but are not limited to, polycrystalline silicon, aluminum, copper, aluminum-copper alloys, aluminum-titanium alloys and gold. Desirably, the layer 18 of conductive material 20 and the layer 22 of conductive material 24 are formed from using physical vapor deposition (PVD) or chemical vapor deposition (CVD) techniques which are known in the art. The layer 18 and the layer 22 can be formed from the same or different conductive materials.

The conductive lines 30 and 32 are formed from any material which conducts an electric current. Exemplary materials useful for forming the conductive lines 30 and 32 include, but are not limited to, polycrystalline silicon, aluminum, copper, aluminum-copper alloys, aluminum-titanium alloys and gold. Desirably, the conductive lines 30 and 32 are formed using PVD or CVD techniques.

The first dielectric material 40 is desirably silicon dioxide although other ceramic oxides such as aluminum oxide, zirconium oxide, and yttrium oxide can also serve as the first dielectric material 40.

The second dielectric material 46 can be formed from the same material as the first dielectric material 40 or from a different material. Desirably, the first dielectric material 40 and the second dielectric material 46 are silicon dioxide. Other materials which can be used to form the second dielectric material 46 include, but are not limited to oxides, nitrides, and carbon-containing oxides.

Figure 2:
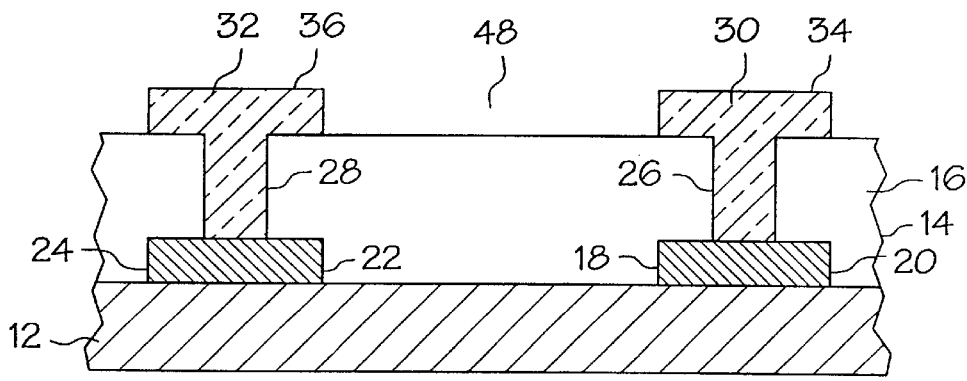
FIGS. 2–4 present cross sectional views of the sequence of steps for making the semiconductor device shown in FIG. 1.
Figure 3:
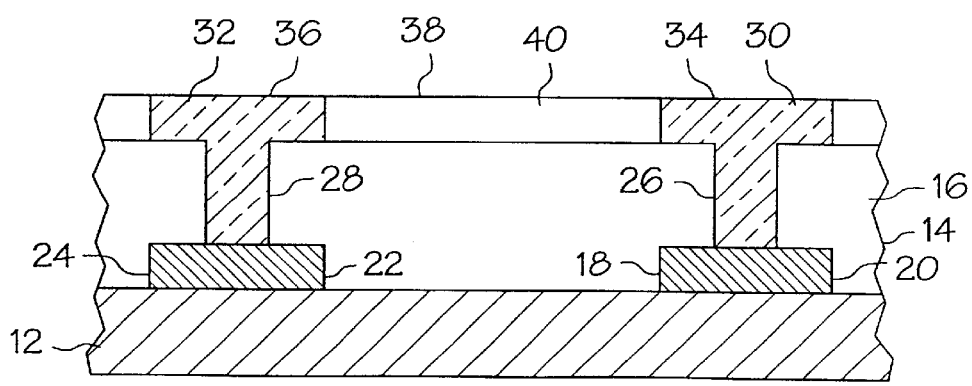
Figure 4:
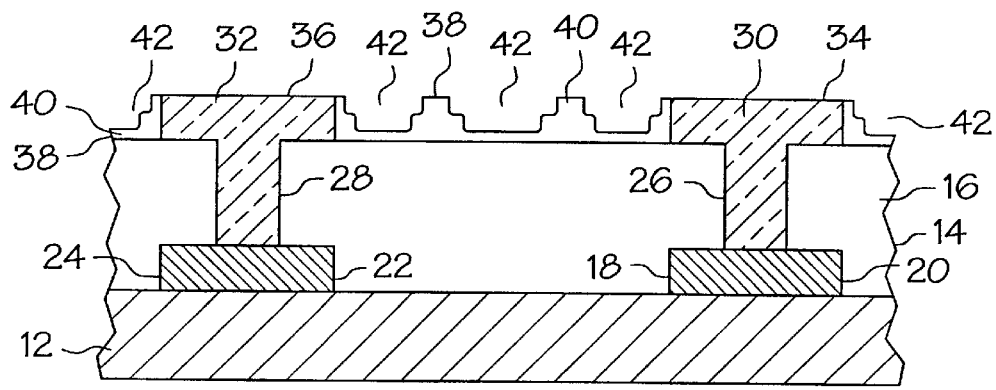

The semiconductor device 10 of the present invention is formed by the following process which is illustrated in FIGS. 2–4. With reference to FIG. 2, the layer 14 of insulation material 16 is formed on at least a portion of the substrate 12 by any conventional deposition or forming process. Next, the layer 18 of conductive material 20 is formed in the layer 14 and is positioned over the substrate 12. The layer 18 of conductive material 20 is formed so that it is surrounded by the layer 14 at least on three sides, or is surrounded on all sides if the layer 18 of conductive material 20 does not contact the substrate 12.

For example, the layer 18 of conductive material 20 can be formed in the following manner. After the layer 14 has been formed on the substrate 12, a layer of a photoresist material is formed on the layer 14. The photoresist layer is then patterned and etched by conventional processes to provide an area in which the layer 18 of conductive material 20 can be formed. The layer 18 of conductive material 20 is then formed in the area by any conventional deposition process. After the layer 18 of conductive material 20 has been formed in the area, the layer 14 is formed over the layer 18 of conductive material 20 to surround the layer 18 of conductive material 20. The layer 22 of conductive material 24 is formed in the same manner as and, desirably, simultaneously with the layer 18 of conductive material 20.

With continuing reference to FIG. 2, the first via 26 and the second via 28 are formed by a conventional masking and etching technique. A layer of a photoresist material is deposited on the layer 14 of insulation material 16 and then the layer of photoresist material is patterned to provide for the via openings. The layer 14 of insulation material 16 is then etched to form the vias 26 and 28 and, after the etching has been completed, the layer of photoresist material is removed.

The first conductive line 30 and the second conductive line 32 are then formed in their respective vias 26 and 28. The conductive lines 30 and 32 are formed by a blanket deposition of a layer of conductive material onto the surface of the layer 14 of insulation material 16. The conductive lines 30 and 32 are formed by any conventional deposition process. The layer of conductive material is then patterned and etched to separate the conductive lines 30 and 32 from each other to prevent short circuits from forming in the circuitry of the semiconductor device 10. One skilled in the art will appreciate that, although conductive lines 30 and 32 are shown as each having a T-shaped cross section, each of the conductive lines 30 and 32 may have any cross section, such an I-shaped cross section, which is currently used in the art. Further, the conductive lines 30 and 32 do not have to have the same cross section. Once conductive lines 30 and 32 have been etched, they define a space 48 therebetween. The space 48 was occupied by the conductive material prior to the etching of the layer of conductive material 20.

As shown in FIG. 3, the layer 38 of first dielectric material 40 is formed between the first conductive line 30 and the second conductive line 32 in the space 48. Desirably, the layer 38 of first dielectric material 40 is formed so that it is substantially coplanar with the surface 34 of the first conductive line 30 and the surface 36 of the second conductive line 32. However, the layer 38 of first dielectric material 40 may be formed to cover the surfaces 34 and 36. The layer 38 of first dielectric material is nonpourous and 40 desirably has a thickness of up to about 1000 Å.

Figure 5:
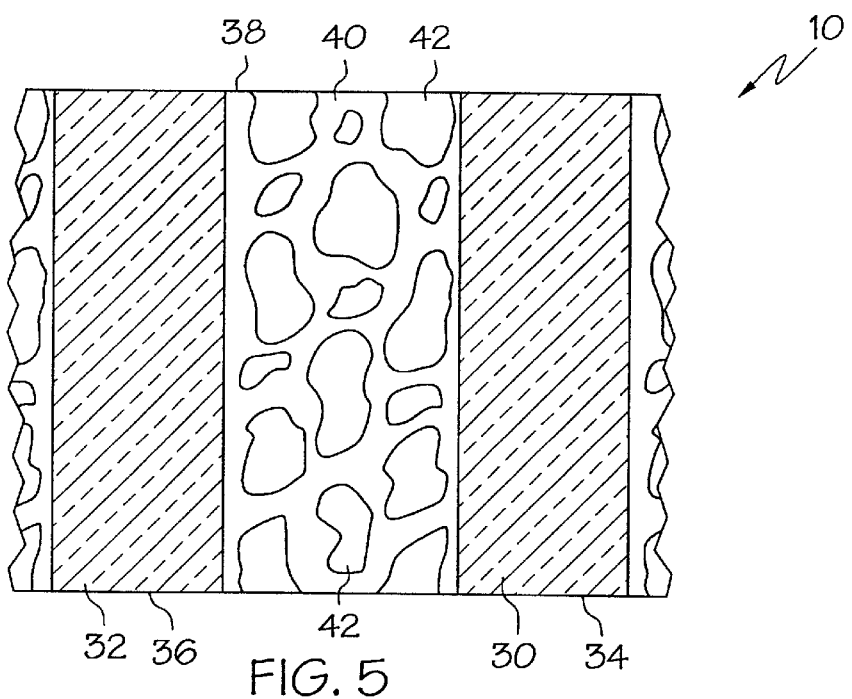
FIG. 5 shows a top view of the semiconductor device shown in FIG. 1 with the top layer of dielectric material being cut away.

After the layer 38 of first dielectric material 40 has been formed on the layer 14 of insulation material 16, the layer 38 of first dielectric material 40 is etched so that nanopores or voids 42 are formed in its surface. These voids 42 are shown in FIG. 4 in a side cross sectional view and in FIG. 5 in a top cross sectional view. The voids 42 are not drawn to scale in FIGS. 4 and 5 and are shown out of scale for ease of illustration. Desirably, the voids 42 will have an effective diameter of from about 2 nm to about 50 nm with the average effective diameter being from 10 nm to about 20 nm.

The voids 42 are formed by exposing the semiconductor substrate 12 to an oxygen plasma at a low partial pressure and a high temperature. To form the voids 42, the substrate 12 is placed into a high density plasma system in which it is exposed to a high density oxygen plasma. A useful high density plasma system is an inductively coupled high density plasma system, such as, for example, a high density plasma system from Applied Materials of Santa Clara, Calif., U.S.A., under the product name "Ultima." Other useful high density plasma systems include electron cyclotron resonance plasma systems or remote microwave plasma systems.

In the high density plasma system, an oxygen plasma desirably having a concentration density of greater than or equal to about $1 \times 10^{11}$ ions/cm$^3$ is employed to etch the voids 42 in the layer 38 of dielectric material 40. The plasma is desirably generated by a power source of from about 5000 Watts to about 6000 Watts. In the high density plasma system, the oxygen plasma typically heats the substrate 12. Desirably, the substrate 12 is heated to as high a temperature as possible without damaging or melting the conductive lines 30 and 32. More desirably, the oxygen plasma heats the substrate 12 from about 400° C. to about 450° C. The pressure in the system is maintained as low as possible to drive the reaction toward void formation. Desirably, the pressure is maintained between about $1 \times 10^{-3}$ Torr and about $100 \times 10^{-3}$ Torr and is more desirably maintained at about $10 \times 10^{-3}$ Torr. This treatment results in layer 38 of dielectric material 40 having a porosity which is preferably greater than about 50%.

Under these particular conditions, when the layer 38 of dielectric material 40 is, for example, SiO$_2$, the following reaction takes place:

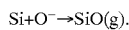

This reaction etches the surface of the silicon dioxide dielectric layer 40 and forms voids 42 in the surface of the layer 38 of dielectric material 40. Desirably, a large number of nano-sized voids are formed through this process. As the voids increase in size, the structural integrity of the layer 38 of dielectric material 40 is threatened. By forming a large number of small voids instead of a small number of larger voids, the structural integrity of the layer 38 of dielectric material 40 is preserved.

In the process of the present invention, the rate of void formation is directly proportional to the concentration of the plasma. The rate of void formation is also directly proportional to the temperature at which the reaction is conducted. Desirably, the reaction is driven by the plasma concentration rather than the temperature at which the reaction takes place so that the temperature does not damage any of the conductive lines, such as conductive lines 30 and 32. By using the plasma to drive the reaction, the temperature at which the reaction takes place can be maintained so that it will not damage the various layers of the semiconductor substrate 12. However, the temperature can also be used to control the void formation in the reaction as long as the temperature is maintained at a point at which it would not damage other components, such as the conductive lines 30 and 32, or other layers on the substrate 12. That is, an increase in the reaction temperature will produce a corresponding increase in the rate at which the voids 42 are formed.

The reaction is conducted for a period of time sufficient to form voids of the desired size. One skilled in the art will appreciate that, as the reaction proceeds, the size of the voids will increase. As the size of the voids increases, the layer 38 of dielectric material 40 loses structural integrity, as described above. Thus, the reaction is desirably allowed to proceed for a period of time until the voids attain a desired size. Desirably, the reaction will proceed until the voids 42 attain the effective diameters set out above.

Further, by using an oxygen plasma to etch the layer 38 of dielectric material 40, layers of substantial thickness may be etched. The process of the present invention can etch voids in layers of up to about 1000 Å in thickness. This is superior to a process which uses molecular oxygen to etch dielectric materials because processes which employ molecular oxygen as an etching tool are only capable of etching layers having a thickness of less than 100Å.

Once the voids 42 have been formed in the layer 38 of dielectric material 40, a second layer, such as layer 44 of second dielectric material 46, can be formed on the layer 38 of first dielectric material 40, as shown in FIG. 1. The layer 44 of second dielectric material 46 is formed so that it encapsulates the surfaces 34 and 36 of the conductive lines 30 and 32, respectively, to insulate the conductive lines 30 and 32. The layer 44 of second dielectric material 46 is formed by any conventional deposition process. The layer 44 of second dielectric material 46 covers the layer 38 of first dielectric material 40 and seals the voids 42 to ensure that no materials, which would increase the dielectric constant of the first dielectric material 40, become deposited in the voids 42. Because the voids 42 have such a small effective diameter, they do not become filled by the layer 44 of the second dielectric material 46.

After the layer 44 of second dielectric material 46 has been formed on the layer 38 of first dielectric material 40, the semiconductor device 10 can be further processed or prepared for shipment if its processing is completed. Additional processing steps include forming additional layers on the layer 44 of second dielectric material 46. These additional layers can contain additional active devices such as capacitors, transistors, resistors, conductive lines, etc. The additional layers may also be passivation materials, insulative materials and/or contain nonactive devices.

Figure 6:
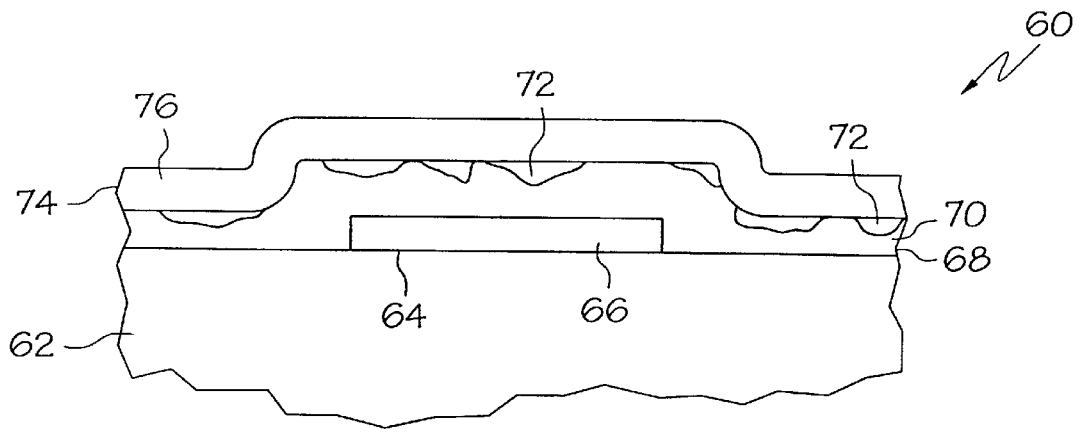
FIG. 6 presents a cross sectional view of an alternate embodiment of a semiconductor device of the present invention.

FIG. 6 presents a cross sectional view of an alternate semiconductor device 60 of the present invention. The semiconductor device 60 is formed similarly to the semiconductor device 10. The semiconductor device 60 includes a semiconductor substrate 62 which is formed from the same materials and in the same manner as described above in regard to substrate 12. A layer 64 of a conductive material 66 is formed on the substrate 62 by conventional deposition and etching processes. The conductive material 66 is formed from the same materials used to form the conductive material 20 and 24, which are described above. A layer 68 of a dielectric material 70 is formed over the layer 64 of conductive material 66. The layer 68 of dielectric material 70 is formed by a conventional deposition process and is formed from the same material which is used to form the first dielectric material 40, which is also described above. The layer 68 of dielectric material 70 has a plurality of voids 72 formed therein. The voids 72 are formed in the same manner as the voids 42, which process is described above. That is, the voids 72 are formed by exposing the layer 68 of dielectric material 70 to a concentration of an oxygen plasma at a temperature and pressure sufficient for the oxygen plasma the etch the layer 68 of dielectric material 70 to form the voids 72 such that the voids 72 reduce the dielectric constant of the dielectric material 70. Finally, an optional layer 74 of a second dielectric material 76 may be formed on the layer 68 of dielectric material 70. The second dielectric material 76 is formed from the same material which is used form the second dielectric material 46, which is also described above.

Figure 7:
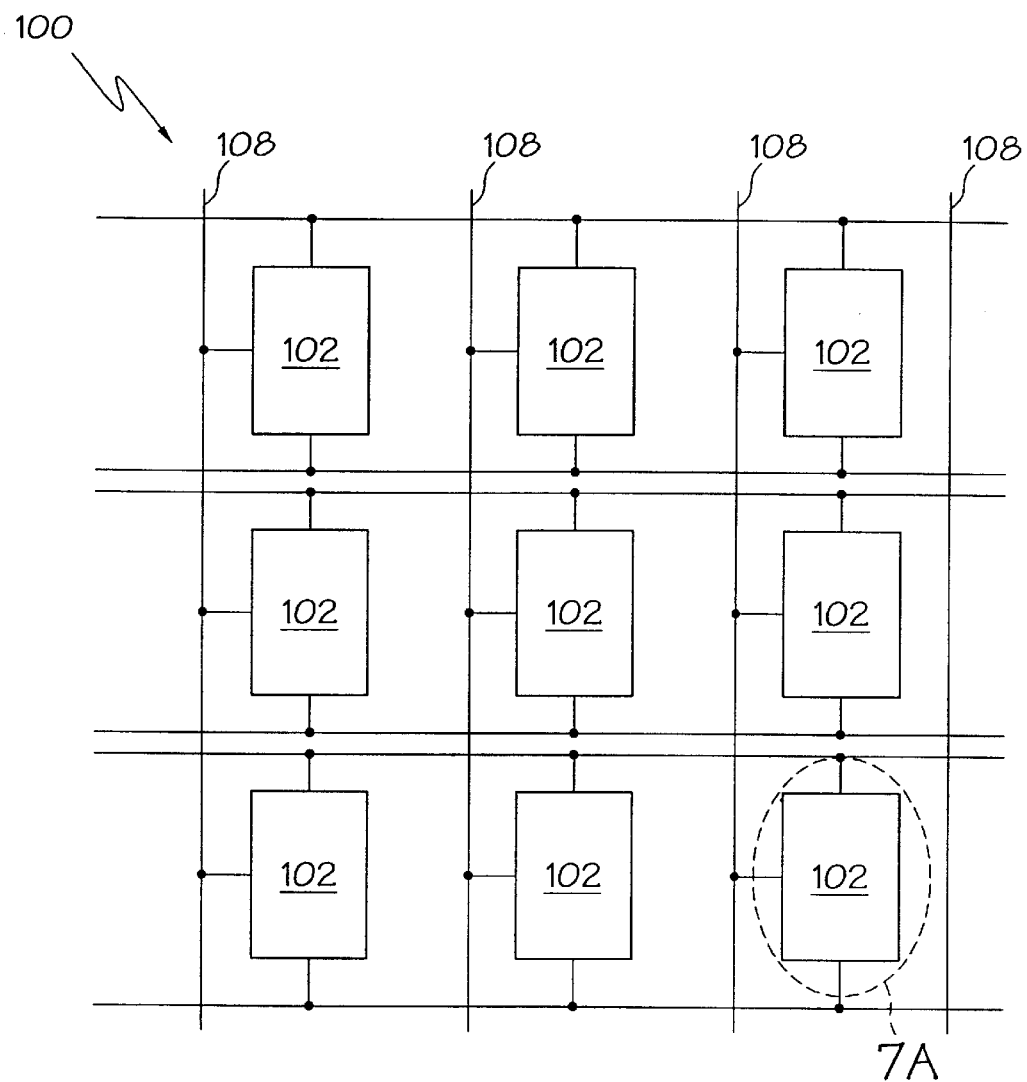
FIG. 7 presents a schematic view of a memory array of the present invention.
Figure 7A:
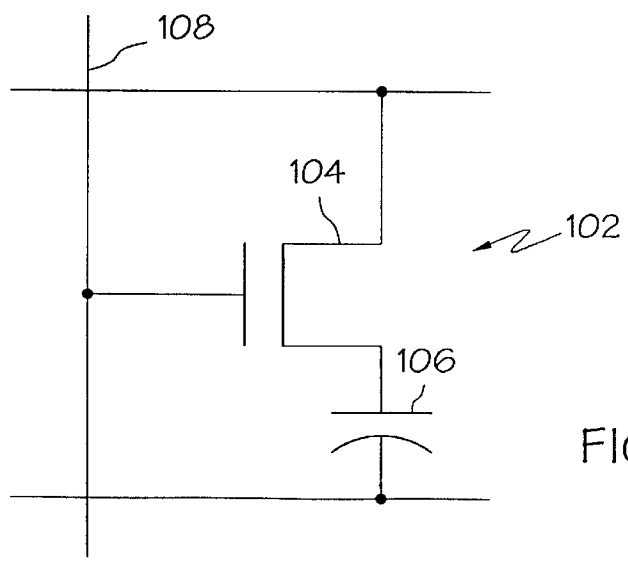
FIG. 7A shows a schematic view of a memory cell of the memory array shown in FIG. 7.

The process of the present invention may be used to form a typical memory array, such as, for example, a static random access memory (SRAM) array or a dynamic random access memory (DRAM) array 100, which is shown in FIG. 7. The DRAM array 100 comprises a plurality of memory cells 102 arranged in rows and columns. As shown in FIG. 7A, each of the memory cells 102 includes at least one field effect transistor 104 and one capacitor 106. Each field effect transistor 104 is coupled to a capacitor 106. The gate of the field effect transistor 104 is coupled to a word line 108 via an interconnect structure, such as conductive lines 30 and 32, described above. The process described above in connection with FIGS. 1–5 can be used to form dielectric layers, such as layer 38 of dielectric material 40, during the fabrication of the memory array 100. It should be apparent that other devices such as other transistors, bipolar transistors, resistors, other capacitors and the like, may be interconnected by conductive lines 30 and 32.

Figure 8:
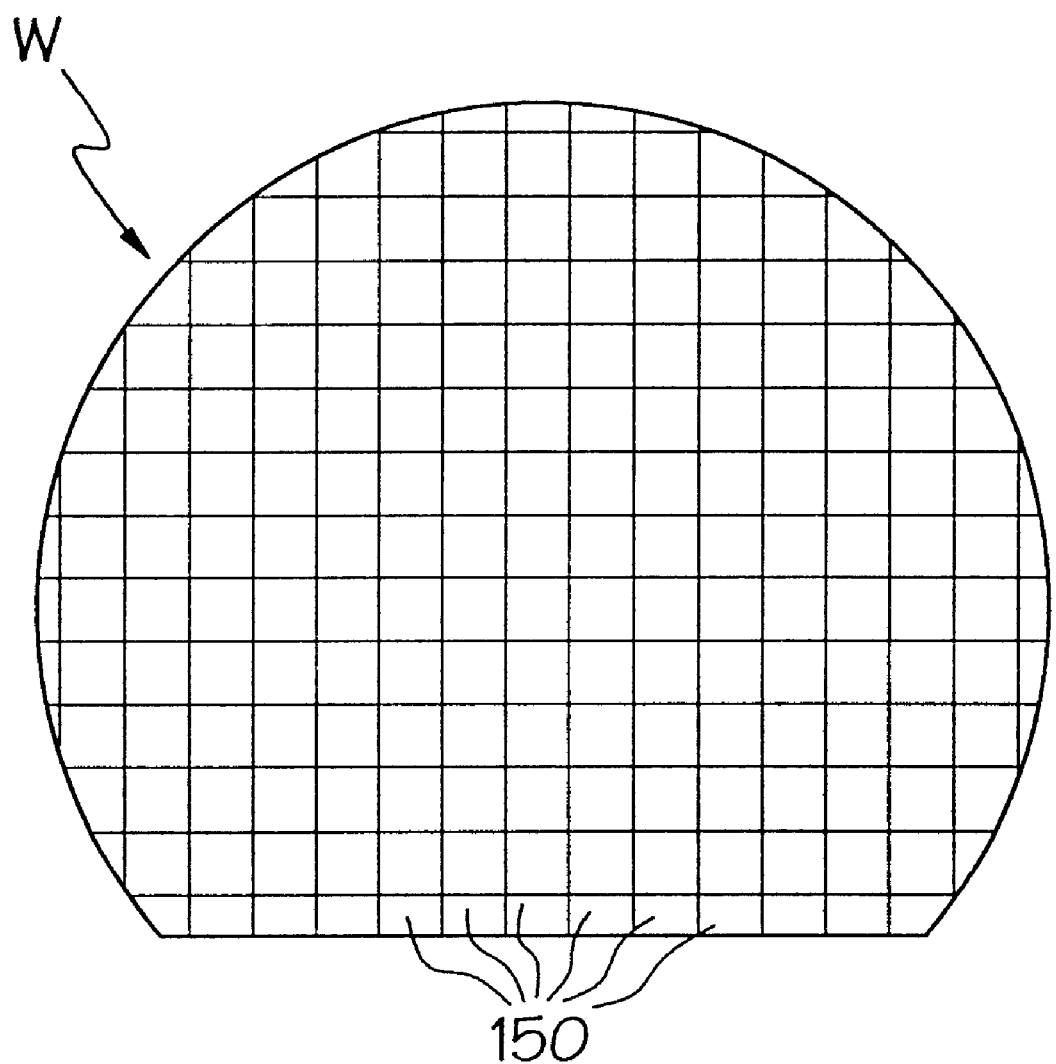
FIG. 8 presents a view of a wafer of the present invention.

The process of the present invention may also used in the fabrication of a wafer W, as is shown in FIG. 8. The wafer W includes a plurality of individual die 150 formed on a semiconductor substrate, such as substrate 12. Wafer masks (not shown) are used to apply a desired circuit structure on each of the individual die 150. The desired circuit structure may comprise any of the above described structures, e.g., the DRAM array 100 or an SRAM array. The wafer W is processed using standard wafer fabrication techniques. Again, the process described above in connection with FIGS. 1–5 can be used form layers of dielectric material having reduced dielectric constants on the wafer W.

One skilled in the art will appreciate that the method of the present invention can be carried out as a stand-alone process, clustered as part of the semiconductor manufacturing process or as an in situ treatment.

One skilled in the art will also appreciate that, although the process of the present invention has been primarily described herein as forming layers of dielectric material between vertically positioned conductive lines, the layers of dielectric material formed by the process of the present invention can be used to form insulative layers between horizontally positioned conductive materials, such as conductive lines 30 and 32.

Having described the invention in detail and by reference to desired embodiments thereof, it will be apparent that modifications and variations are possible without departing from the scope of the invention which is defined in the appended claims.

What is claimed is:

1. A semiconductor device comprising:
    a semiconductor substrate;
    a plurality of active devices disposed on said substrate;
    a plurality of multilevel interconnection layers disposed on said substrate, at least one interconnection layer having at least one pair of conductive lines, said conductive lines defining a space therebetween; and
    a layer of a dielectric material formed in at least a portion of said space, said dielectric material including a plurality of voids.

2. The semiconductor device of claim 1 further including a layer of a second dielectric material formed over said layer of dielectric material such that said layer of second dielectric material covers said conductive lines.

3. The semiconductor device of claim 2 which said layer of said second dielectric material seals said voids in said layer of dielectric material but does not fill said voids.

4. The semiconductor device of claim 1 in which said voids have a diameter of from between about 2 to about 50 nanometers.

5. The semiconductor device of claim 1 in which said layer of dielectric material has a thickness of up to about 1000 Å.

6. The semiconductor device of claim 1 in which said layer of dielectric material comprises a silicon oxide.

7. The semiconductor device of claim 1 in which said voids are located in the surface of said layer of said dielectric material.

8. A memory array comprising:
    a semiconductor substrate;
    a plurality of memory cells arranged in rows and columns on said semiconductor substrate, each of said plurality of memory cells comprising at least one field effect transistor, each of said field effect transistors comprising a source, a drain and a gate formed on said semiconductor substrate;
    a plurality of conductive lines interconnecting said memory cells, a portion of said plurality of conductive lines defining spaces therebetween; and
    a layer of a dielectric material formed in at least a portion of said spaces, said layer of dielectric material having a plurality of voids formed therein.

9. The memory array of claim 8 further including at least one layer of a second dielectric material formed on at least a portion of said layer of dielectric material.

10. The memory array of claim 9 in which said layer of said second dielectric material seals said voids in said layer of dielectric material but does not fill said voids.

11. The memory array of claim 8 in which said voids have a diameter of from between about 2 to about 50 nanometers.

12. The memory array of claim 8 in which said layer of dielectric material has a thickness of up to about 1000 Å.

13. The memory array of claim 8 in which said layer of dielectric material comprises a silicon oxide.

14. The memory array of claim 8 in which said voids are located in the surface of said layer of said dielectric material.

15. A semiconductor wafer comprising:
- a semiconductor substrate;
- a repeating series of sources, drains and gates for a plurality of field effect transistors on each of a plurality of individual die over said semiconductor substrate;
- a plurality of conductive lines to interconnect said field effect transistors, at least two of said lines defining a space therebetween; and
- a layer of a dielectric material formed in at least a portion of said space, said dielectric material including a plurality of voids formed therein.

16. The semiconductor wafer of claim 15 further including a layer of a second dielectric material formed on at least a portion of said layer of dielectric material.

17. The semiconductor wafer of claim 16 in which said layer of said second dielectric material seals said voids in said layer of dielectric material but does not fill said voids.

18. The semiconductor wafer of claim 15 in which said voids have a diameter of from between about 2 to about 50 nanometers.

19. The semiconductor wafer of claim 15 in which said layer of dielectric material has a thickness of up to about 1000 Å.

20. The semiconductor wafer of claim 15 in which said layer of dielectric material comprises a silicon oxide.

21. The semiconductor wafer of claim 15 in which said voids are located in the surface of said layer of said dielectric material.

* * * * *

UNITED STATES PATENT AND TRADEMARK OFFICE
CERTIFICATE OF CORRECTION

PATENT NO.   : 6,258,724 B1                                          Page 1 of 1
DATED        : July 10, 2001
INVENTOR(S)  : Sujit Sharan It is certified that error appears in the above-identified patent and that said Letters Patent is hereby corrected as shown below:

Column 3,
Line 53, "plasma at a, temperature" should be -- plasma at a temperature --.

Column 8,
Line 62, "such an" should be -- such as an --.

Column 10,
Line 9, "the - reaction" should be -- the reaction --.

Column 11,
Line 25, "the etch the" should be -- to etch the --.
Line 31, "used form the" should be -- used to form the --.
Line 64, "used form layers" be -- used to form layers --.

Signed and Sealed this

Nineteenth Day of February, 2002

Attest:

*Attesting Officer*

JAMES E. ROGAN
*Director of the United States Patent and Trademark Office*